United States Patent [19]
Stoddard et al.

[11] Patent Number: 5,895,596
[45] Date of Patent: Apr. 20, 1999

[54] MODEL BASED TEMPERATURE CONTROLLER FOR SEMICONDUCTOR THERMAL PROCESSORS

[75] Inventors: Kevin Stoddard, Phoenix, Ariz.; Jean Benoit Hugues, Kalispell, Mont.; Konstantinos Tsakalis, Phoenix, Ariz.

[73] Assignee: Semitool Thermal, Kalispell, Mont.

[21] Appl. No.: 08/791,024

[22] Filed: Jan. 27, 1997

[51] Int. Cl.$^6$ ..................................................... H05B 1/02
[52] U.S. Cl. ...................... 219/497; 219/483; 219/486; 118/725; 364/477; 392/416
[58] Field of Search ...................... 219/483–486, 219/481, 497, 505, 508; 374/110; 392/416, 418, 405, 411; 118/724, 725, 50.1; 364/477, 557

[56] References Cited

U.S. PATENT DOCUMENTS

| | | | |
|---|---|---|---|
| 4,276,603 | 6/1981 | Beck et al. | 364/477 |
| 4,688,180 | 8/1987 | Motomiya | 364/477 |
| 4,711,989 | 12/1987 | Yu | 219/390 |
| 4,761,538 | 8/1988 | Chiba et al. | 219/497 |
| 4,937,434 | 6/1990 | Nakao | 219/390 |
| 5,099,442 | 3/1992 | Furuta et al. | 364/557 |
| 5,258,601 | 11/1993 | Takano | 219/486 |
| 5,280,422 | 1/1994 | Moe et al. | 364/140 |
| 5,291,514 | 3/1994 | Heitmann et al. | 373/135 |
| 5,517,594 | 5/1996 | Shah et al. | 392/416 |

FOREIGN PATENT DOCUMENTS

WO 96/12386    4/1996    WIPO.

OTHER PUBLICATIONS

B. J. Van Schravendijk et al., "Modeling and control of the wafer temperatures in a diffusion furnace", *Journal of Applied Physics*, Feb. 15, 1987, pp. 1620–1627.

"Control of MMST RTP: Repeatability, Uniformity, and Integration for Flexible Manufacturing", by Charles Schaper et al., *IEEE Transactions on Semiconductor Manufacturing*, pp. 1–24 and drawings.

"Adaptive Temperature Control of Industrial Diffusion/LPCVD Reactors", by H. De Waard & W.K. De Koning, IFAC Intelligent Tuning and Adaptive Control, Singapore, 1991.

T.A. Badgwell et al., "In situ measurement of wafer temperature in a low pressure chemical vapor deposition furnace", *American Institute of Physics*, pp. 1129–1133.

"Modeling, Identification, and Control of Rapid Thermal Processing Systems", by Charles Schaper et al., *Journal of the Electrochemical Society*, Sep. 1993, pp. 1–29 and drawings.

"Temperature Distribution in Semiconductor Wafers Heated in a Vertical Diffusion Furnace", by Shigeki Hirasawa et al., *IEEE Transactions on Semiconductor Manufacturing*, Aug. 1993, pp. 226–232.

(List continued on next page.)

*Primary Examiner*—Mark Paschall
*Attorney, Agent, or Firm*—Wells, St. John, Roberts, Gregory & Matkin, P.S.

[57] ABSTRACT

Controllers and associated methods for controlling a thermal reactor or other thermal semiconductor processors which include a heating element powered by a power source, and having profile thermocouples and spike thermocouples. One preferred method comprises the following steps: modeling thermal dynamic characteristics of the thermal reactor, the modeling step including providing thermocouple instrumented wafers in the thermal reactor, perturbing the thermal reactor by controlling the heating element using a stimulation sequence, and developing models based on changes in temperature created by the perturbations. The models are developed off-line and can include one or more models, such as a model of power versus spike thermocouple readings, a model of spike thermocouple readings versus profile thermocouple readings, and a model of profile thermocouple readings versus thermocouple instrumented wafer readings. On-line models are further derived and used during operation to control power input to the zones of the thermal processor using measured profile and spike temperatures. The models can be cascaded or selectively activated to achieve different control regimes.

12 Claims, 10 Drawing Sheets

OTHER PUBLICATIONS

"Optimization of Transient Temperature Uniformity in RTP Systems", by Stephen Norman, IEEE Transactions on Electron Devices, Jan. 1992, pp. 205–207.

"Frequency Shaping", Chapter 9, pp. 262–289.

"Optimization Problems for Dynamic Systems", Chapter 2, pp. 42–89. "Optimization Problems for Dynamic Systems with Path Constraints", Chapter 3, pp. 90–127.

"Model Identification in Rapid Thermal Processing Systems", by Young Man Cho & Thomas Kailath—IEEE Transactions on Semiconductor Manufacturing, Aug. 1993, pp. 233–245.

"Optimal Control of the Wafer Temperatures in Diffusion/LPCVD Reactors", by H. De Waard and W.L. De Koning, pp. 243–252, 1992—International Federation of Automatic Control.

Chapter 8, "System Identification", pp. 349–416. Chapter 9, "Multivariable and Optimal Control", pp. 417–483.

"Appendix 4A: Identifiability of Black–Box Multivariable Model Structures", Models of Linear Time–Invariant Systems, pp. 114–126.

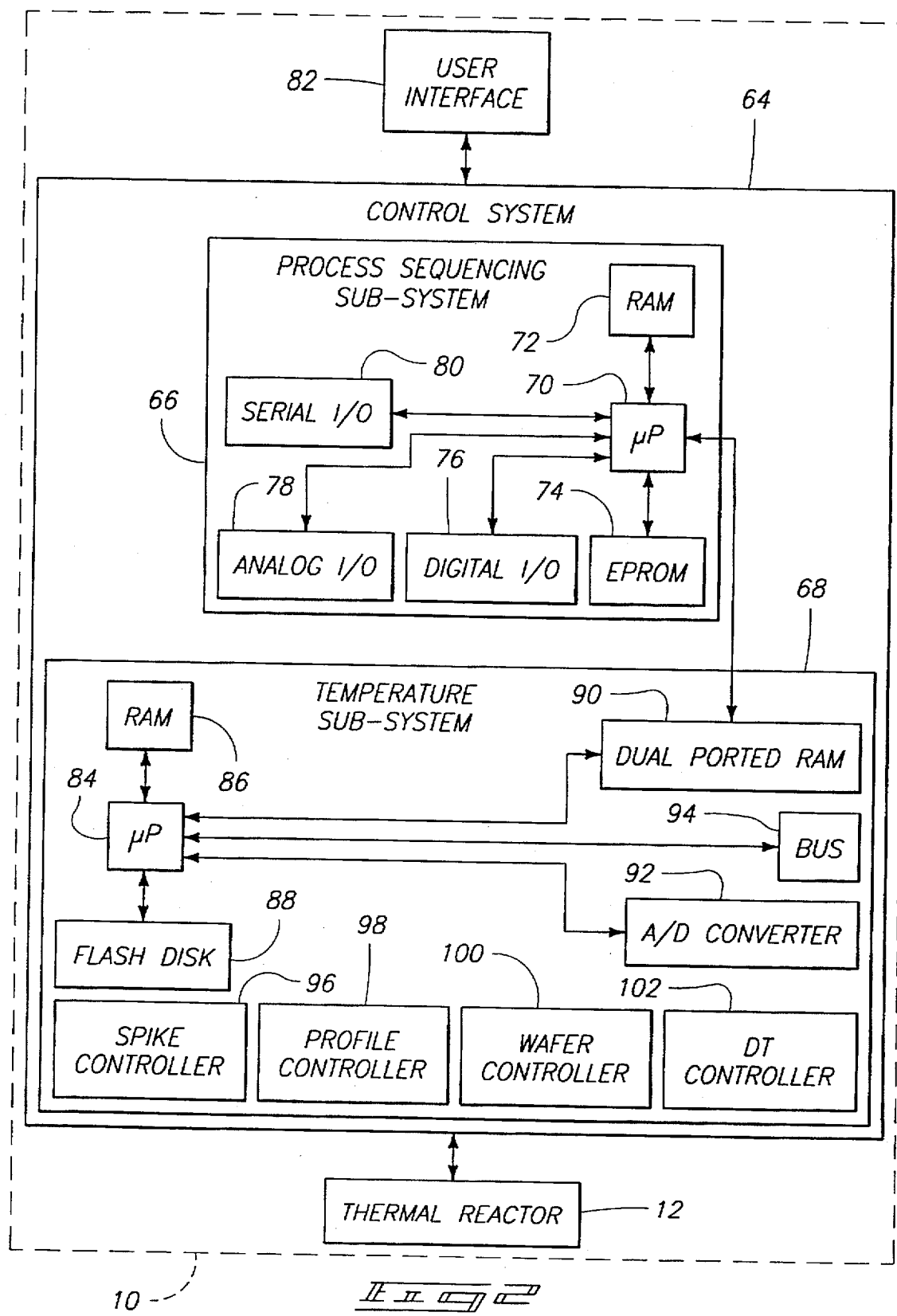

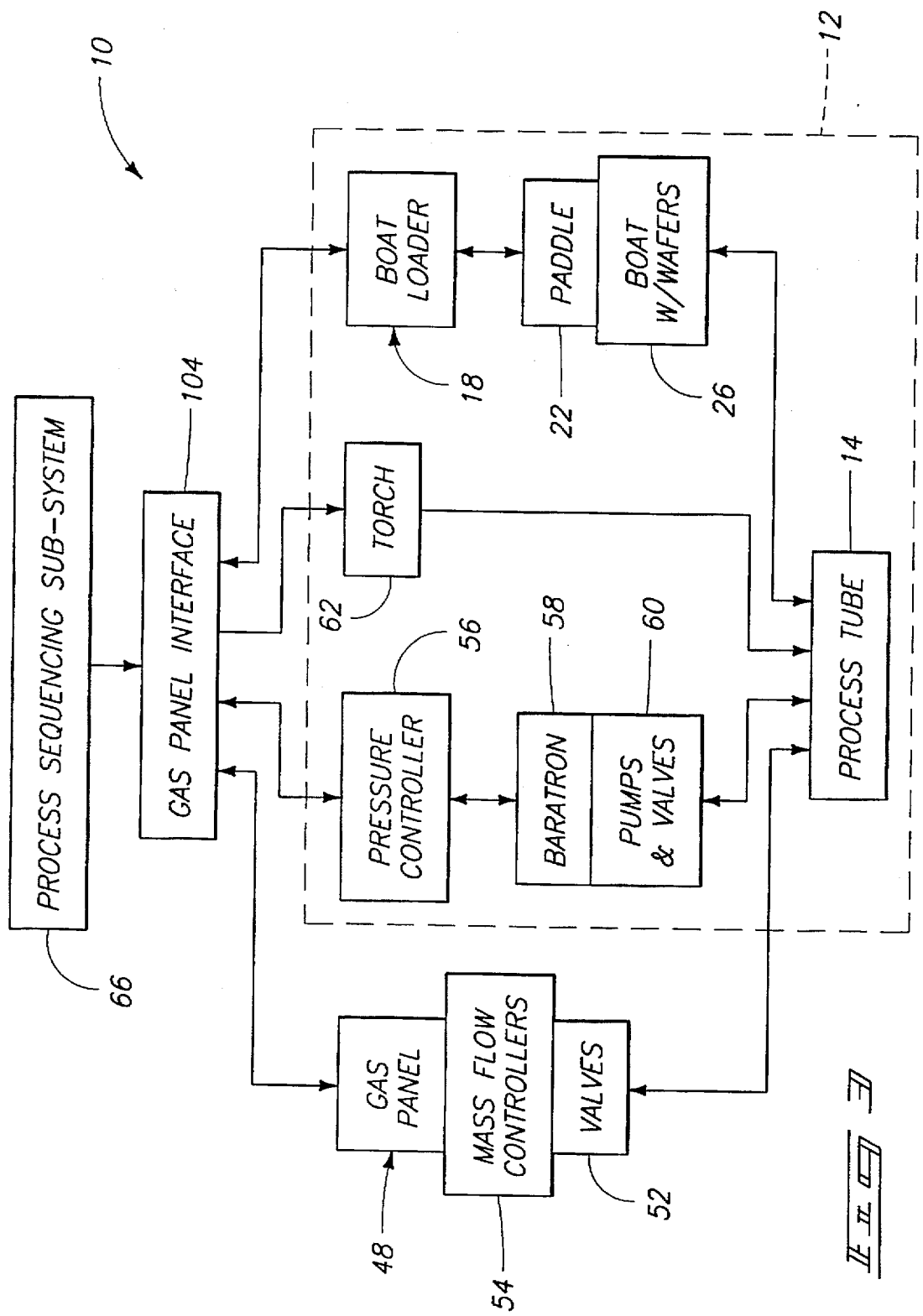

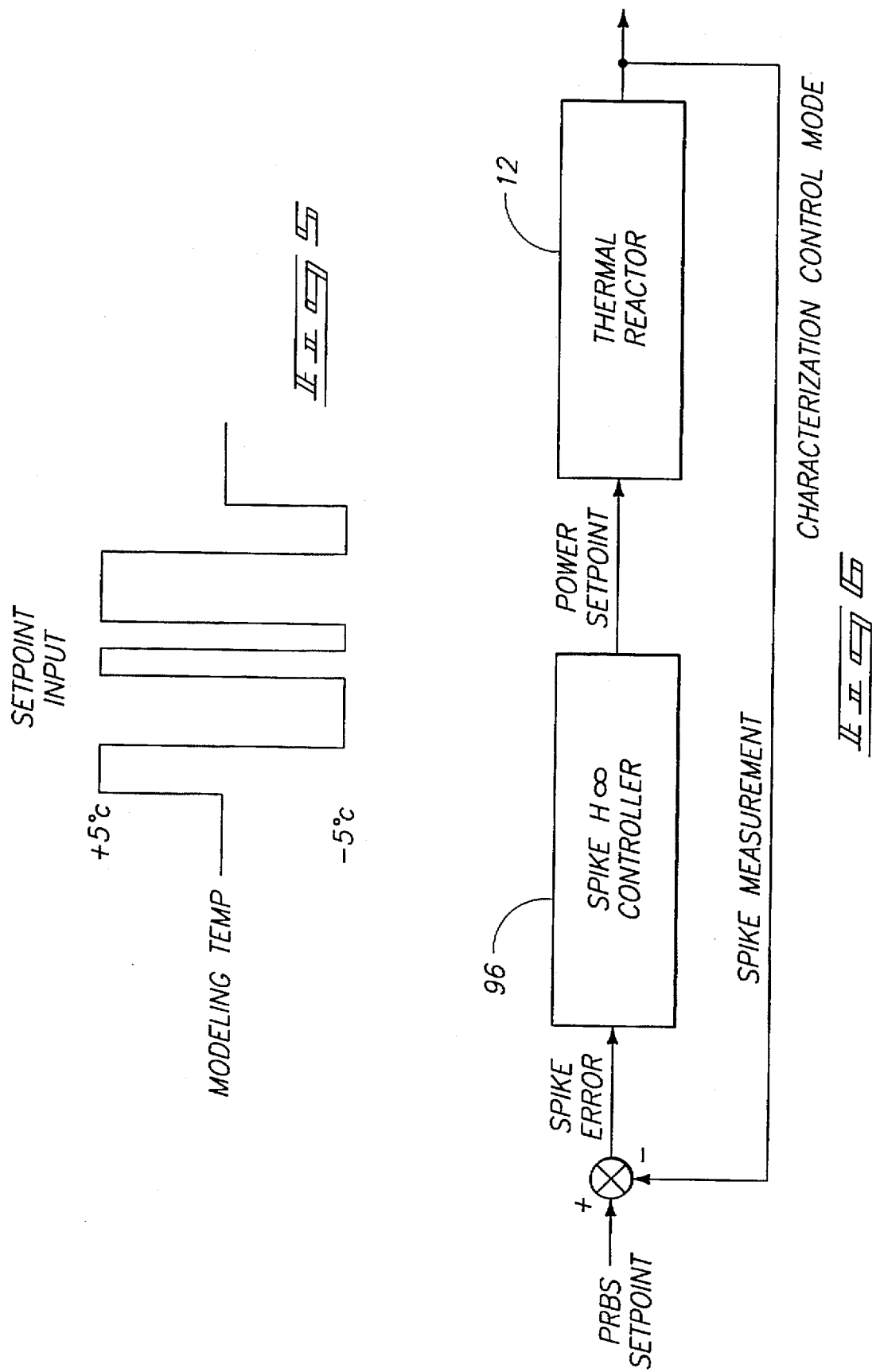

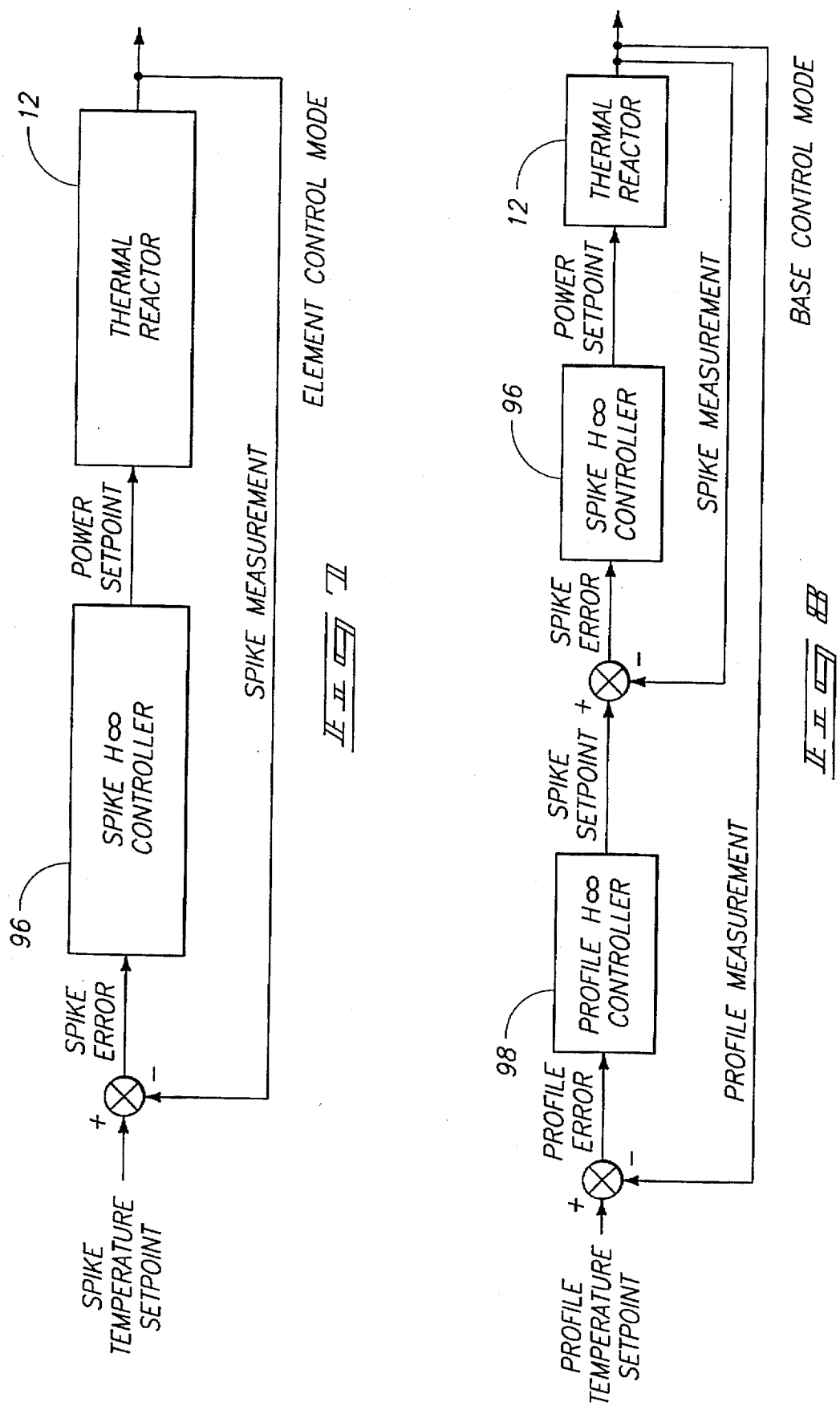

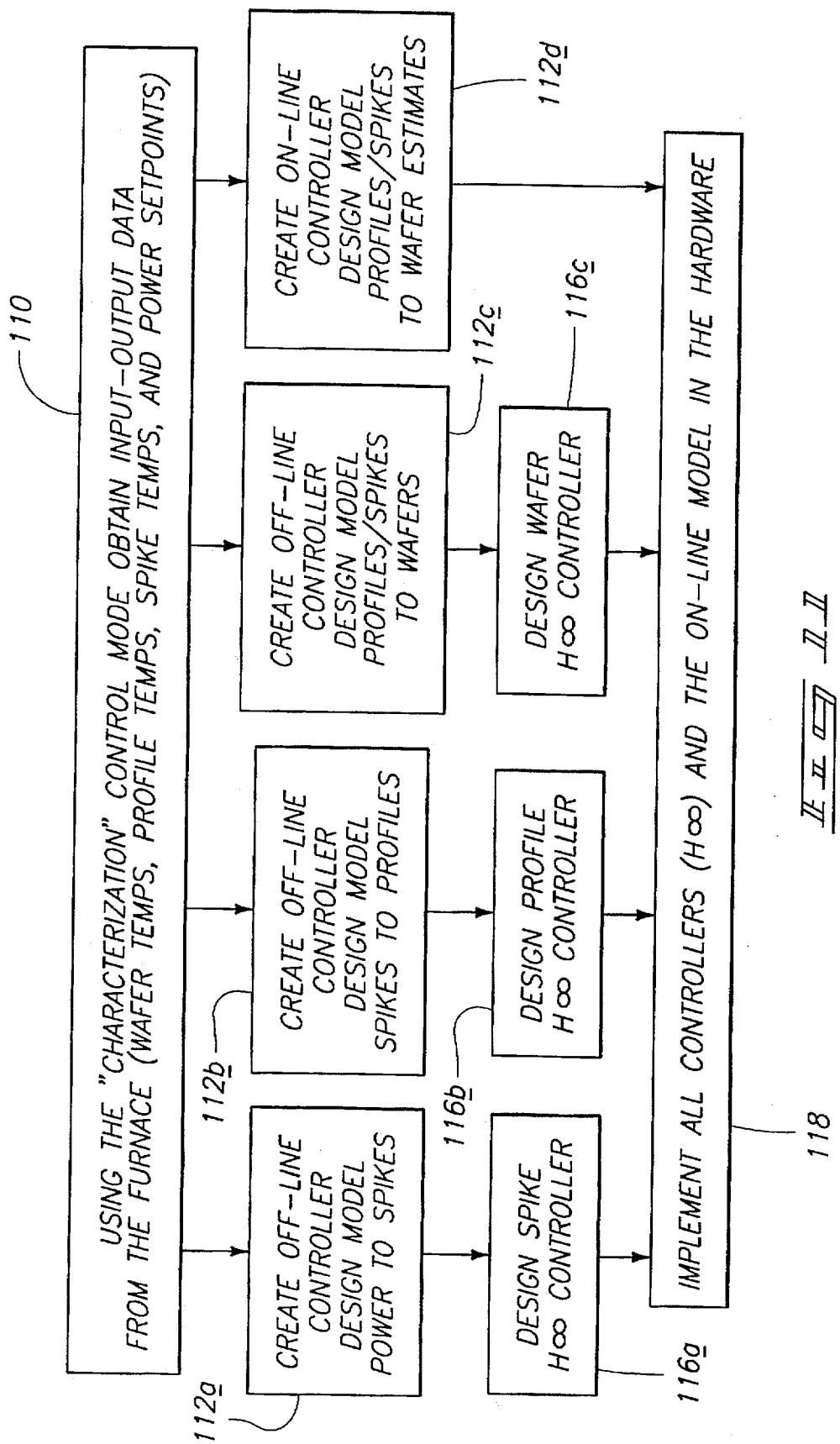

MODEL BASED TEMPERATURE CONTROLLER FOR SEMICONDUCTOR THERMAL PROCESSORS

TECHNICAL FIELD

The invention relates to semiconductor processing methods and apparatus. More particularly, the invention relates to process controllers principally for controlling temperature and possibly other process variables in thermal reactors and other processors used in semiconductor processing.

BACKGROUND OF THE INVENTION

The processing of semiconductor wafers has become of great economic significance due to the large volume of integrated circuits being produced and the significant value associated with such circuits. Competitive pressures have driven dramatic changes in production. Foremost among these is the reduction in size of the various features of an integrated circuit which make up the transistors and other devices being formed on the integrated circuits. This reduction in feature size has been driven to achieve greater levels of integration, more sophisticated and complex circuits, and to reduce production costs by obtaining more integrated circuits on each wafer being produced.

Even though feature sizes used in integrated circuits have decreased dramatically, additional reductions are continuously being pursued. The temperature at which wafers are processed has a first order effect on the diffusion of dopants, deposition of materials or other thermal processes being performed. Thus it is important to have processing equipment which can achieve accurate temperature control to meet desired thermal processing specifications. As feature size decreases, the importance of accurate temperature control during processing increases to even a greater degree.

Traditionally, semiconductor thermal reactors have used Proportional-Integral-Derivative (PID) controllers to control temperature. Although such controller have the advantage of easier operation and maintenance, they are of limited accuracy in controlling temperatures. This limited accuracy imposes limitations on the achievable size and yield of integrated circuits.

The more typical PID controller parameters are experimentally tuned by adjusting the gain values or selected using a variety of tuning rules (e.g., Ziegler-Nichols). Such control methods give relatively less accurate control of the temperature of the thermal reactor with associated limitations on production yield and consistency of the resulting integrated circuits or other semiconductor items being produced.

More complex control schemes have been devised, but these more complex schemes frequently are so complex computationally that on-line operation is either not possible or not feasible. More complex control schemes have also in some cases not been used because of difficulties in achieving required control system tuning and maintenance at the production facility. This has been of somewhat greater concern with regard to controllers operated by engineers who do not have strong control system backgrounds. As a result is it often difficult for them to resolve all of the complexities imposed in adjusting the control system to the variations in their specific processor performance. This is exacerbated by variations in the same processor with time and changing conditions.

The temperature control problems encountered in thermal processing of semiconductor devices can be thought of in several different ways. One control problem involves matching the wafer temperature to the desired overall or average target or recipe temperature of the processor. The problem involves both achieving the desired recipe temperature and in achieving relatively consistent temperatures from one production run to another.

The desired overall or average recipe temperature of the processor can conveniently be thought of in terms of three different phases. The first phase is typically a ramp-up phase wherein the average operating temperature increases or ramps from a low level when processing is begun. The temperature ramp-up phase is thereafter typically followed by a period during which a desired maximum or other constant processing temperature is maintained. Such a constant temperature phase includes a stabilization period during which the changing temperature ramp ends and a constant or near constant temperature is achieved. Constant temperature phases may occur one or more times in a processing cycle. A further phase is the ramp-down phase wherein the average temperature of the processor in decreasing. Appreciate that various processes may include more than one of each of these three different phases.

Whether simple or more complex temperature plans or recipes are used, each phase may further be complicated by the introduction of one or more supplementary processing gases or vapor phase processing constituents which affect temperature and thermal response. Such supplementary processing gases are typically gases containing dopants, deposition materials or steam.

Another temperature control problem is to achieve relatively similar temperature exposures or histories during a processing cycle for each of the wafers or other semiconductor workpieces being processed within a batch. Temperature variations routinely occur with regard to wafers positioned near the ends of the array of wafers held within a processing furnace. There may also be other less predictable variations from wafer to wafer, such as along the array of wafers contained within the processing array.

A still further temperature control problem is associated with temperature variations across an individual wafer or other semiconductor workpiece being processed. This area of variability is exemplified by the geometry of most processing furnaces which have a grouping of multiple electrical heating elements formed in rings which surround the array of wafers being processed. Heat from the heating elements is being radiated through the processing vessel and variations can occur with regard to the heat gain experienced by the peripheral areas of the wafer as compared to the interior areas. Variations in the degree of radiant heat transfer and radiant shadowing which occur from wafer to wafer further exacerbates this problem.

Another noteworthy consideration is the manufacturing concern to minimize the processing time used to effect a particular process or group of processes being carried out with the thermal processor. Minimizing the processing time will typically increase the ramp-up phase temperature change rate. Conversely, time concerns will also increase the ramp-down phase temperature change rate. Increased rates of temperature change cause greater difficulties in maintaining recipe temperatures during the processes of transitioning between ramp-up and stabilization phases, and between stable temperatures and relatively rapid temperature ramp-down phases.

Given these complexities and somewhat countervailing considerations, there is great difficulty in achieving improved control systems which are both practical and workable for improved thermal processing of semiconductor wafers.

BRIEF DESCRIPTION OF THE DRAWINGS

FIG. 3 is a block diagram illustrating operation of a process sequencing subsystem and gas interface.

FIG. 5 is a waveform diagram illustrating an exemplary pseudo-random binary sequence used to characterize the reactor of FIG. 1A.

FIG. 6 is a control diagram of a characterization control mode which uses the pseudo-random binary sequence of FIG. 2 to characterize the reactor of FIG. 1A prior to actual use in processing semiconductor wafers.

FIG. 7 is a control diagram of an element control mode logic circuit, which employs a spike controller.

FIG. 8 is a control diagram of a base control mode logic circuit, which employs a profile controller and the spike controller of FIG. 7.

FIG. 11 is a flowchart illustrating design of the preferred controllers.

DETAILED DESCRIPTION OF THE PREFERRED EMBODIMENTS

Figure 1:
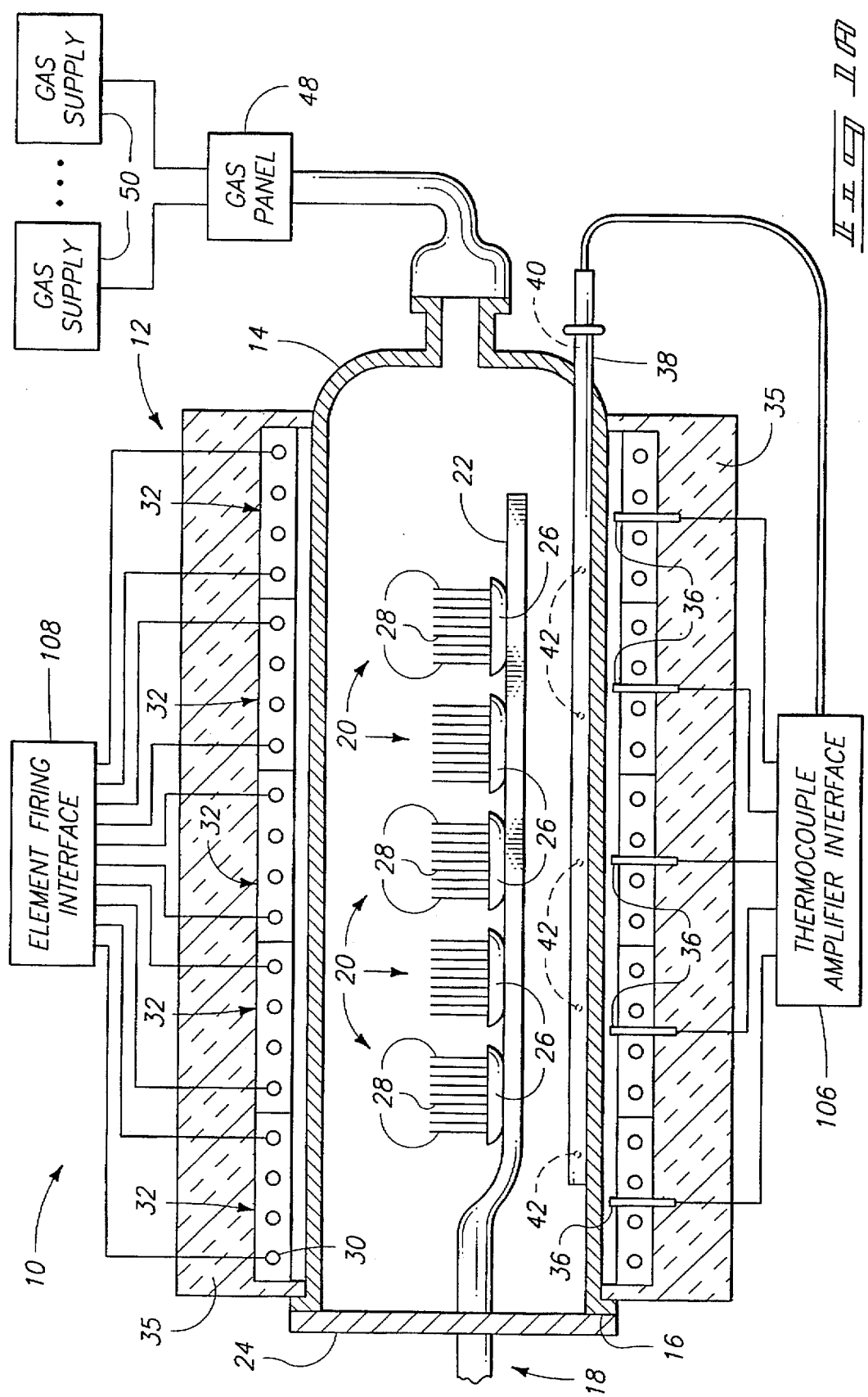
FIG. 1A is a side elevational view, partially in section, of a thermal reactor system embodying the invention.
FIG. 1B is a side elevational view, partially in section, of the thermal reactor system of FIG. 1A during modeling and characterization using thermocouple instrumented wafers.

This disclosure of the invention is submitted in furtherance of the constitutional purposes of the U.S. Patent Laws "to promote the progress of science and useful arts" (Article 1, Section 8).

The invention provides controllers and methods for controlling a thermal reactor or processor used to process semiconductor workpieces. The typical thermal reactor includes a heating element powered by a power source, and has profile thermocouples and spike thermocouples. A preferred method comprising the following steps: modeling thermal dynamic characteristics of the thermal reactor, the modeling step including providing thermocouple instrumented wafers in the thermal reactor, perturbing the thermal reactor by controlling the heating element using a stimulation sequence, and developing models based on changes in temperature created by the perturbations, the models including a model of power versus spike thermocouple readings, a model of spike thermocouple readings versus profile thermocouple readings, and a model of profile and spike thermocouple readings versus thermocouple instrumented wafer readings.

One aspect of the invention provides a controller unit for controlling a thermal reactor supporting a heating element powered by a power source, profile thermocouples and spike thermocouples, and selectively receiving thermocouple instrumented wafers, the controller unit comprising an input device receiving a recipe; and a plurality of selectable control mode logic circuits communicating with the profile thermocouples and spike thermocouples, the control mode logic circuits being used to control the heating element relative to the recipe.

Another aspect of the invention provides a method for controlling a thermal reactor including a thermal reactor supporting a heating element powered by a power source, profile thermocouples, and spike thermocouples, and selectively receiving thermocouple instrumented wafers, the method comprising the following steps: modeling thermal dynamic characteristics of the thermal reactor using the profile thermocouples, spike thermocouples, and instrumented wafers; receiving a recipe including desired temperatures with respect to time, and the recipe including desired control modes with respect to time; and switching from one control mode to another in accordance with the recipe, and controlling temperature differently in the different control modes, using temperature information obtained from the profile thermocouples and spike thermocouples.

Another aspect of the invention provides a controller unit for controlling a thermal reactor supporting a heating element powered by a power source, profile thermocouples and spike thermocouples, the controller unit comprising: an on-line model which predicts wafer temperature; and a plurality of selectable control mode logic circuits which control the heating element in response to the on-line model, and temperature information obtained from the profile thermocouples, and spike thermocouples during operation.

Another aspect of the invention provides a method of controlling a thermal reactor supporting a heating element powered by a power source, profile thermocouples, and spike thermocouples, the method comprising: controlling energy provided to the thermal reactor relative to desired energy, by using measurements from profile thermocouples and taking the integral of $e^{(-2/kT)}$ where k is Boltzmann's constant and T is temperature measured using the profile thermocouples.

Another aspect of the invention provides a controller unit for controlling a thermal reactor supporting a heating element powered by a power source, profile thermocouples and spike thermocouples, the controller unit comprising: a thermal budget controller which controls energy provided to the thermal reactor relative to desired energy, by using measurements from profile thermocouples and taking the integral of $e^{(-2/kT)}$ where k is Boltzmann's constant and T is temperature measured using the profile thermocouples.

Another aspect of the invention provides a method for controlling a thermal reactor including a thermal reactor supporting a heating element powered by a power source, profile thermocouples and spike thermocouples, the method comprising the following steps: modeling thermal dynamic characteristics of the thermal reactor; receiving a recipe including desired temperatures with respect to time, and the recipe including desired control modes with respect to time; and switching from one control mode to another in accordance with the recipe, and controlling temperature differently in the different control modes, using temperature information provided by the profile thermocouples and spike thermocouples, the control modes being defined by cascaded controllers.

Another aspect of the invention provides a controller unit for controlling a thermal reactor supporting a heating element powered by a power source, profile thermocouples and spike thermocouples, the controller unit comprising: an on-line model which predicts wafer temperature; and a plurality of cascaded selectable control mode logic circuits which control the heating element in response to one or more of: the profile thermocouples, spike thermocouples, and the on-line model.

Another aspect of the invention provides a controller unit for controlling a thermal reactor supporting a heating element powered by a power source, profile thermocouples and spike thermocouples, the controller unit comprising an on-line model which predicts wafer temperature based on measurements from the spike and profile thermocouples; and a plurality of selectable control mode logic circuits, the control mode logic circuits including a base control mode logic circuit having a spike controller which controls power supplied to the heating element in response to measurements by the spike thermocouples, and a profile controller which controls the spike controller in response to measurements by the profile thermocouples; a thermal budget control mode logic circuit which measures energy provided to the thermal reactor and controls energy provided to the thermal reactor with respect to desired energy, the thermal budget control mode logic circuit employing the spike controller, and the profile controller, and the thermal budget control mode logic circuit further including a Dt controller controlling the profile controller; and a dynamic control mode logic circuit which controls energy provided to the thermal reactor based on predicted wafer temperature, the dynamic control mode logic circuit employing the spike controller, the profile controller, and the on-line model, the dynamic control mode logic circuit further including a wafer controller in communication with the on-line model and controlling the profile controller.

FIG. 1A shows a thermal reactor system 10 embodying the invention. The thermal reactor system 10 includes a thermal reactor 12. The thermal reactor 12 can either be horizontal or vertical in orientation.

The thermal reactor 12 includes a process tube 14 defining a chamber. The process tube 14 is preferably made of quartz, or silicon carbide. In the illustrated embodiment, the process tube is in the general shape of a hollow cylinder having an open end 16. The process tube 14 has a length which extends along and substantially defines a longitudinal axis. The thermal reactor system 10 further includes a boat loader or paddle 18 which inserts or removes a wafer load 20 into or from the process tube 14. More particularly, the boat loader 18 includes a support portion 22, and a door portion 24 which is movable with the support portion and which closes the open end of the process tube 14 when the support portion 22 is inserted into the process tube. The door portion 24 seals and insulates the process tube to prevent heat loss after the wafer load 20 has been inserted into the process tube 14.

The wafer load 20 includes a plurality of boats 26. In the illustrated embodiment, the boats 24 are formed of quartz or silicon carbide. The wafer load 20 further includes a plurality of silicon wafers 26, and each boat 24 supports a plurality of the wafers 26. In the illustrated embodiment, wafers on each boat 24 are equally spaced. The boat or boats of wafers 26 generally form a wafer or other semiconductor workpiece processing array.

Figure 4:
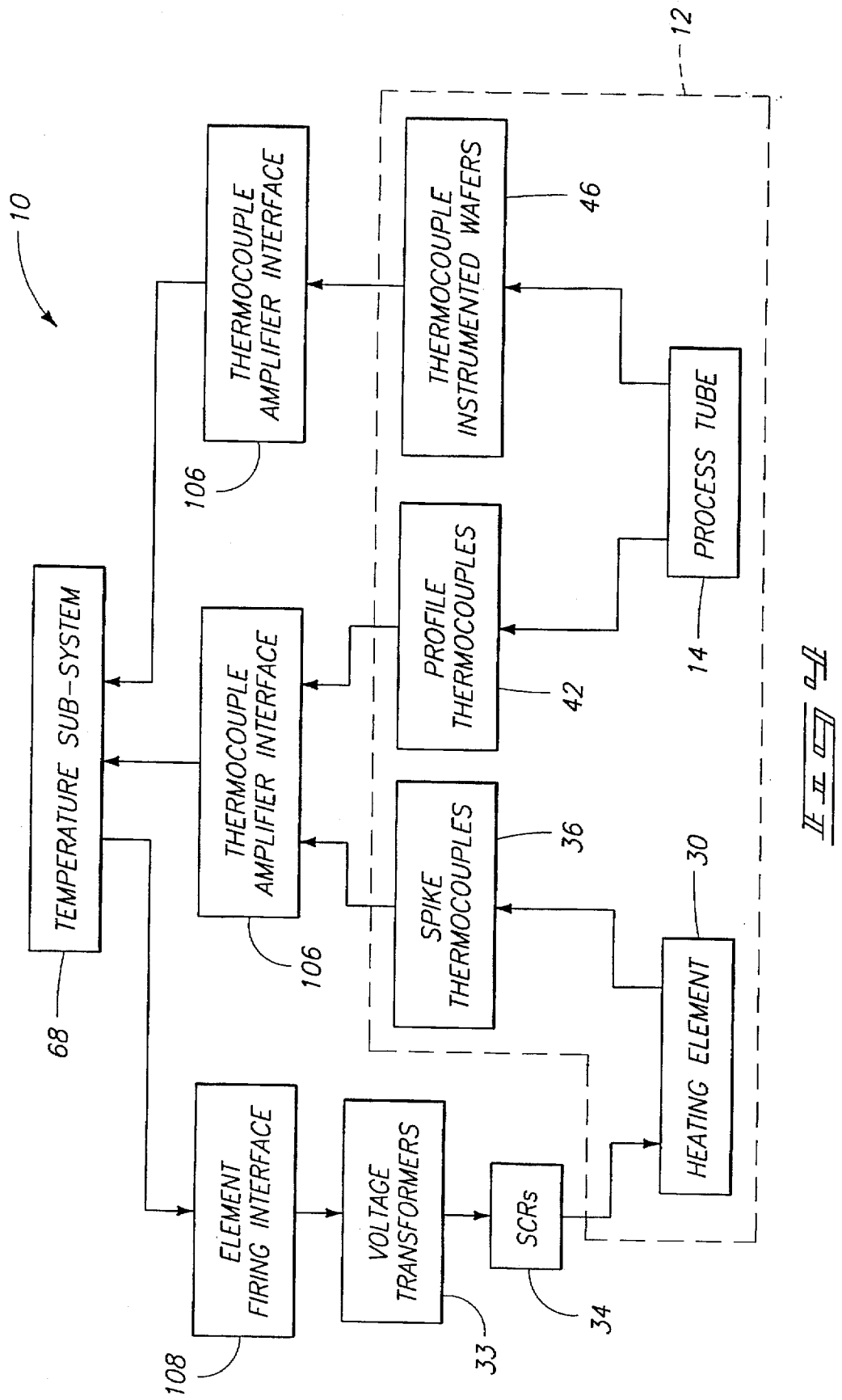
FIG. 4 is a block diagram illustrating operation of a temperature subsystem.

The thermal reactor 12 includes a heating element 30 surrounding the process tube 14. In the illustrated embodiment, the heating element 30 is an electrical resistance heating coil or coils extending along the length of the processing chamber parallel to the length of the process tube 14. The heating element 30 is subdivided into a plurality of separately controllable heating zones 32. The zones 32 are defined by providing connections along the coil to divide the coil or coils into the separately controllable zones. The zones are then separately controllable by supplying power to opposite ends of each zone associated coil or portion of a larger coil. More particularly, the thermal reactor system 10 further includes (FIG. 4) high current voltage transformers 33 and silicon controlled rectifiers (SCRs) 34 for controllably applying power to each of the heating zones 32.

The thermal reactor 12 further includes ceramic insulation 35 encasing the heating element 30. The insulation also serves to reflect and otherwise direct heat toward the wafer array and serves to provide a more uniform layer to minimize heat flux variations away from the processing array.

The thermal reactor 12 further includes a plurality of spike thermocouples 36. Thermocouples as the term is used herein encompasses potentially a variety of temperature sensors, including the more specific meaning of thermocouples. Alternative temperature sensor constructions are intended by the use of the term thermocouples. The spike thermocouples 36 are placed at a suitable location, such as between the heating element 30 and the process tube 14. The spike thermocouples 36 are spaced apart along the length of the of the heating element 30, and a spike thermocouple 36 is located in each of the heating zones 32. The spike thermocouples 36 provide the most specific and responsive indications of the temperature at or of the heating elements in each of the heating zones.

The thermal reactor 12 further includes a profile temperature sensor sheath 38 extending inside the process tube 14. The process tube 14 has a bottom surface, and the process tube 14 is supported on the bottom surface of the process tube 14 in an orientation parallel to the length of the process tube. The sheath 38 extends at least partially across each of the heating zones 32. In the illustrated embodiment, the sheath 38 is formed of quartz or silicon carbide.

The thermal reactor 12 further includes an elongated profile rod 40 supported in the sheath 38. The profile rod 40 has a length parallel to the length of the process tube 14. The profile rod 40 includes a plurality of thermocouples 42 equally spaced apart along the length of the rod 40, and one thermocouple 42 is located in each of the heating zones 32. The thermocouples 42 are not necessarily aligned with the spike thermocouples 36 in the direction of the length of the process tube 14. The profile rod 40 measures temperature inside the process tube 14 and provides an indication of the temperature of the wafer load 20 in each of the heating zones.

A plurality of thermocouple instrumented wafers 44 are optionally employed during modeling of the thermal reactor. FIG. 1B shows the thermal reactor 12 of FIG. 1A receiving the thermocouple instrumented wafers 44 during modeling. These thermocouple instrumented wafers 44 are uniformly spaced across the wafer load 16 to provide an accurate measurement of the actual temperature of the wafers 28. The wafers or other workpieces being formed of silicon or other semiconductor materials being processed. Each of the exemplary thermocouple instrumented wafers 44 includes a silicon wafer, and two thermocouples 46 bonded to the silicon wafer: one on the edge of the wafer, and one on the center of the wafer. The thermocouples 46 of each thermocouple instrumented wafer 44 are bonded to the silicon wafer, such as with a ceramic adhesive, to provide accurate temperature measurements.

The thermal reactor system 10 further includes a gas delivery system or gas panel 48 controllably injecting process gases from selectable gas supplies 50 into the process tube 14 to grow, diffuse, or deposit material on the surface of the silicon wafers 28. The gas panel 48 includes (FIG. 3) valves 52 and mass flow controllers 54. The mass flow controllers 52 are used to measure and control flows of process gasses into the process tube 14.

In some embodiments, the process tube 14 is pressurized for low pressure chemical vapor deposition (LPCVD) processes. In these embodiments, the thermal reactor 12 further includes (FIG. 3) a pressure controller 56. In these embodiments, the thermal reactor system 10 further includes a baratron or other suitable pressure sensing device 58 which measures the pressure in the process tube and communicates the measured pressure to the pressure controller 56. Further, in these embodiments, the thermal reactor system 10 further includes pumps and valves 60, in communication with the pressure controller 56, to achieve the desired pressure in the process tube 14.

In some embodiments, the thermal reactor 12 further includes (FIG. 3) a torch 62 internal or external to the process tube 14. The torch 62 is used for wet oxidation processes by burning a ratio of hydrogen and oxygen to produce steam in the process tube 14.

Figure 2:
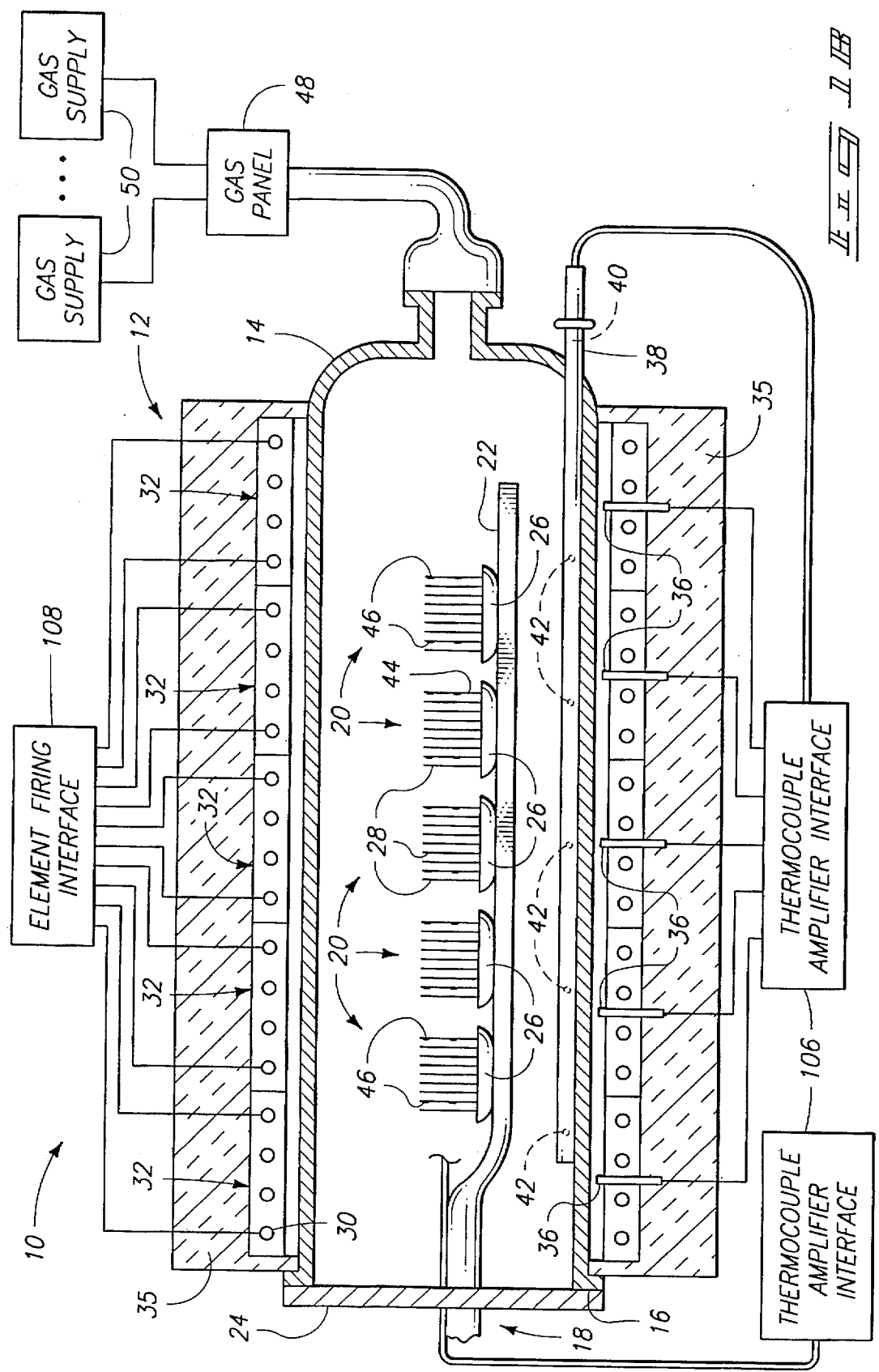
FIG. 2 is a block diagram illustrating a preferred temperature controller according to the invention.

The thermal reactor system 10 includes (FIG. 2) a control system 64 controlling the thermal reactor 12. The control system 64 includes two subsystems: a process sequencing subsystem 66 for process sequencing, and a temperature subsystem 68 for temperature control. Each subsystem 64 and 66 includes a microprocessor, such as an Intel PC, 286, 386, 486, Pentium, or higher, or clone thereof, or Motorola 6800, 68000 or higher, or other microprocessor.

While other microprocessors can be used, in the illustrated embodiment, the process sequencing subsystem 66 employs a 6800 microprocessor 70. The process sequencing subsystem includes random access memory 72 and a programmable EPROM 74 that stores controller logic. The process sequencing subsystem 66 further includes a plurality of digital input and output channels 76 as well as a plurality of analog input and output channels 78. The process sequencing subsystem 66 further includes a plurality of serial input and output channels 80 for external (remote) communication, if external communication is desired. The process sequencing subsystem 66 follows a user defined process recipe. More particularly, the thermal reactor system 10 further includes a user interface 82 defining an input device. While other user interfaces can be employed, in the illustrated embodiment the user interface 82 comprises a touch screen terminal interface with which a user can enter a user defined process recipe. In the process recipe, the user can define, on a per step basis, step time, gas flows, chamber pressure, temperature setpoints, and ramp rates.

While other microprocessors can be employed, in the illustrated embodiment, the temperature subsystem 68 includes a 486 microprocessor 84. The temperature subsystem 68 further includes dynamic random access memory 86 for use with the microprocessor 84. For example, in the illustrated embodiment, the temperature subsystem 68 controller unit includes four megabytes of dynamic random access memory. The temperature subsystem 68 controller unit of the illustrated embodiment further includes a two megabyte flash disk 88, a dual ported random access memory 90, a sixteen bit analog to digital converter 92, and a PC/104 bus 94. The temperature subsystem includes a plurality of multivariable controllers 96, 98, 100, and 102 constructed using robust optimal control theory with empirically derived models of the furnace and wafers. More particularly, in the illustrated embodiment, the multivariable controllers 96, 98, 100, and 102 are constructed using H-Infinity control theory.

In the illustrated embodiment, the control system 64 further includes (FIG. 3) a gas panel interface 104 connected between the gas panel 48 and the process sequencing subsystem 68. The gas panel interface 104 provides the control system 64 with an interface to communicate with the mass flow controllers 54, the gas valves 52, the internal or external torch 62, the pressure controller 56, the boat loader 18, etc. Further, the gas panel interface 104 includes a plurality of hardware safety interlocks for the thermal reactor (e.g., to ensure hydrogen flow with a proper oxygen to hydrogen ratio, to detect a flame from the torch 62, etc.).

In the illustrated embodiment, the control system 64 further includes (FIG. 4) a temperature interface connected between the thermocouples 36, 42, and 44 and the temperature subsystem 68. More particularly, in the illustrated embodiment, the temperature interface comprises thermocouple amplifier interface boards 106. In the illustrated embodiment, the temperature subsystem communicates with up to two thermocouple amplifier interfaces: one for measuring spike and profile thermocouples 36 and 42, and one for measuring the thermocouples 46 of the thermocouple instrumented wafers 44 (if thermocouple instrumented wafers are employed). In the illustrated embodiment, the control system 64 further includes (FIG. 4) an element firing interface 108 connected between the heating element 30 and the temperature subsystem 68. The element firing interface 108 includes one firing board for each of the defined heating zones 32. These firing boards use a zero-point switching technique to apply or discontinue power at zero crossings of the voltage waveform.

A process of designing the controllers 96, 98, 100, and 102 is illustrated in detail in FIG. 11.

In a characterization control mode (FIG. 6, and step 110 of FIG. 11), the thermal dynamic characteristics of the thermal reactor are modeled using spike, profile, and wafer temperatures as well as power setpoints during excitation using a random or other stimulation sequence (FIG. 5). In the illustrated embodiment, a pseudo-random binary sequence (PRBS) is employed. More particularly, in the characterization control mode (FIG. 6), the thermal reactor is brought up to operating temperature and then perturbed using the pseudo-random binary sequence, causing gradual temperature fluctuations in the thermal reactor. In steps 112a-d, models are created based on changes in temperature created by the perturbations. In the illustrated embodiment, all models are derived using a linear least squares minimum distance system identification technique. In the illustrated embodiment, all models are represented and implemented in statespace form.

In the illustrated embodiment, two types of models are created: off-line and on-line. By "off-line model," what is meant is a model that is created for control system design. By "on-line model," what is meant is a model that is active during the operation of the thermal reactor 12, such as to process actual semiconductor wafers 28.

In the illustrated embodiment, three off-line models are developed: a power setpoint vs. spike thermocouple model; a spike thermocouple vs. profile thermocouple model; and a profile and spike thermocouple vs. thermocouple instrumented wafer model. Each off-line model is used to design the controllers 96, 98, 100, and 102 in the temperature subsystem.

In the illustrated embodiment, a single on-line model 114 is developed to estimate wafer temperature during operation of the thermal reactor 12. The on-line model 110 predicts the actual temperature of the wafers 28 using real temperature measurements from the spike and profile thermocouples 36 and 42. Because modeling of the entire thermal reactor 12 is complicated and very susceptible to variations and maintenance operations over time, simple modeling of the relationship between the wafer temperatures and the measured profile and spike temperatures is performed to provide an accurate indication of the wafer temperatures during dynamic changes in temperature. Further, it is assumed that under steady-state conditions the profile temperatures are indicative of the actual temperatures of the wafers 28.

After modeling, in steps 116a, 116b, and 116c (FIG. 11), the three off-line models are used to create three separate and unique controllers: the spike controller 96, the profile controller 98, and the wafer controller 100. The spike controller 96 uses the difference between the spike setpoints and spike thermocouple measurements as inputs, and then outputs the power setpoints to the firing interface 108. The profile controller 98 uses the difference between the profile setpoints and the profile measurements as inputs and then outputs spike setpoints to the spike controller 96. The wafer controller 100 uses the difference between the wafer setpoints and predictions of the on-line wafer temperature model as inputs and then outputs profile setpoints to the profile controller 98. In the illustrated embodiment, each controller 96, 98, and 100 is designed using H-Infinity robust optimal control theory. More particularly, in the illustrated embodiment, each of these controllers are multivariable, in which the interaction between heating zones is taken into consideration to provide improved temperature response to the desired ramp or setpoint.

The design of the controllers 96, 98, and 100 will now be described in greater detail. The controllers 96, 98, and 100 are designed using data obtained from an identification experiment. The design procedure comprises two main steps; namely, system identification and controller design. The preferred embodiment employs high performance numerical analysis software such as MATLAB (TM) and SIMULINK (TM) in modeling and in controller design.

System Identification or Characterization

The system identification or characterization step involves making empirical measurements of the processor temperature response characteristics in response to known thermal input. The response is measured by the spike thermocouples 36, profile thermocouples 42 and the temperature sensing wafers 46. The measured response data is analyzed using a suitable analytical technique to achieve a model or models which provide predictive indication of wafer temperatures based upon the spike and profile thermocouple temperatures which can be measured during actual processing of wafers. However, to achieve the needed system thermal response characterization it is necessary to utilize the temperature sensing wafers 46 or other measuring techniques which at least at this time must be done in a separate characterizing phase before actual operational processing begins.

One preferred technique for deriving the characterization information involves using a least-squares parameter estimation algorithm to obtain estimates of the system parameters which reflect temperature response characteristics. The main objectives of this step are the identification of a system model that describes the input-output data and the estimation of uncertainty bounds that describe the confidence in the model. For this purpose, we consider systems described by the general state-space model:

$$\dot{x}=Ax+Bu; \quad y=Cx+Du$$

where x is the state vector, u is the input vector having m number of inputs, and y is the output vector having n number of outputs. Matrix A has dimensions n×n. Matrix B has dimensions n×m. Matrix C has dimensions m×n. And matrix D has dimensions m×m. The coefficients of the matrices are parameters which are derived and potentially adjusted for the particular model being developed to optimize the model's successful operation.

Assuming that (A,C) is observable (all modes of the state-space equation can be observed at the output), the above model can be written as:

$$\dot{x}=(A-LC)x+(B-LD)u+Ly; \quad y=Cx+Du$$

where A-LC is a Hurwitz matrix (see various texts on control theory, such as Kailath, T., *Linear Systems*, Prentice-Hall, Englewood Cliffs, N.J., 1980).

This implies that the above linear system can be described by:

$$\dot{x}=Fx+\theta_1 u+\theta_2 y; \quad y=qx+du$$

where (F,q) is observable, F is the Hurwitz matrix and $\theta_1$, $\theta_2$, and d are matrices representing the adjustable parameters of the model.

By taking a Laplace transform of the previous equation, we have:

$$sIx(s)-x(0)=Fx(s)+\theta_1 u(s)+\theta_2 y(s); \quad y(s)=qx(s)+du(s)$$

where I is the identity matrix and x(o) are the initial conditions of the states.

Next, by solving for the states we obtain:

$$x(s)=(sI-Fx)^{-1}[\theta_1 u(s)+\theta_2 y(s)+x(0)]$$

Now solving for the output using the above state equation to obtain:

$$y(s)=q(sI-Fx)^{-1}[\theta_1 u(s)+\theta_2 y(s)+x(0)]+du(s)$$

Reorganizing into common terms the above equation becomes:

$$y(s)=[q(sI-Fx)^{-1}\theta_1+d]u(s)+q(sI-F)^{-1}\theta_2 y(s)+q(sI-F)^{-1}x(0)$$

All are scalar transfer functions, therefore they may be transposed to obtain:

$$y(s)=\theta_1^T(sI-F^T)^{-1}q^T u(s)+\theta_{2T}(sI-F^T)^{-1}q^T y(s)+du(s)+x(0)^T(sI-F^T)^{-1}q^T$$

For single-input, single-output systems, the last equation can be written in the convenient for parameter estimation linear model form:

$$y=\theta^T w$$

where $\theta$ is a vector containing the adjustable parameters $\theta_1$, $\theta_2$, d as well as the possibly unknown initial conditions x(0), while w contains the signals $(sI-F^T)^{-1}q^T u$, $(sI-FT)^{-1}q^T y$, u, and $(sI-F^T)^{-1}q^T$.

Thus, the basic system identification step comprises the following sub-steps:

1. Perform an experiment to generate input-output time sequences.
2. Compute the filtered signals w.
3. Estimate the parameters of the linear model $y=\theta^T w$.
4. Compute the corresponding state-space representation [A,B,C,D] of the identified system.
5. Reduce the order of the identified system, if necessary.
6. Compute error bounds (uncertainty) for the identified system.

These substeps of the system identification step will now be described in greater detail.

The identification or characterization experiment relies on the generation of an input signal which provides sufficient excitation to the thermal reactor so as to allow the reliable identification of its parameters. Several types of excitation signals have been proposed in the literature (see, for example, Ljung, L., *System Identification: Theory for the User*, Prentice-Hall, Englewood Cliffs, N.J., 1980). For reasons of design simplicity, the illustrated embodiment employs the pseudo-random binary sequence (PRBS) to provide the desired excitation. Furthermore, in order to avoid extensive experimentation requirements in selecting the size of the excitation, the identification is performed in closed-loop. That is, prior information about the thermal reactor to be identified is used to design a simple controller (e.g., proportional or proportional-integral). The pseudo-random binary sequence excitation is then fed as a reference input (set-point) to the controller and the resulting control inputs and thermal reactor outputs are measured.

Although such an approach seems restrictive in that it requires a preliminary controller design, in practice this requirement is not too severe. Typically, elementary crude models of the thermal reactor are available or can easily be derived or, as it is often the case, simple controllers have been already implemented. Practical experience indicates that the identification results are not too sensitive to the controller used as long as its bandwidth and performance are reasonable. Of course, if this is not the case, the identification and controller design steps can be iterated using the new controller in the next identification experiment, until adequate performance is obtained.

The design of the pseudo-random binary sequence requires more attention. This type of excitation is implemented as a sequence of step changes in the reference commands about the nominal operating condition of the thermal reactor. Pseudo-random binary sequences can be defined by two vectors:

$$[t_1, t_2, \Lambda] \quad [m_1, m_2, \Lambda]$$

where the first vector indicates switching times and the second indicates the deviation from the nominal set-point (± maximum deviation level). The randomness in the pseudo-random binary sequence enters in the switching times where $t_{i+1} - t_i$ is a random number. The maximum level and the minimum and maximum duration of each pulse are the design parameters of a pseudo-random binary sequence. In general, the level should be selected as large enough to provide a good signal-to-noise ratio (SNR) but small enough so as to avoid big deviations from the nominal operating condition, which will introduce interference from the ever-present plant nonlinearities. This is precisely where closed-loop identification has an advantage because even a crude controller will keep the plant response around the nominal within, roughly, the PRBS level. The duration of each pseudo-random binary sequence pulse should be such that the resulting sequence has most of its power around the desired closed-loop bandwidth (and closed-loop crossover) which is where the reactor model should be reliable. Finally, the total length of the pseudo-random binary sequence is dictated by memory and experiment-time limitations, but it should be long enough to allow for noise averaging and the observation of the plant response at a sufficient number of frequencies. Roughly, a rule of thumb is to observe the response of the thermal reactor to 7–10 PRBS pulses whose duration is selected according to the previous criteria.

For multivariable system identification, multiple PRBS inputs must be generated, one for each channel. These should be further restricted to be independent of each other, in the sense that the resulting regressor vector has a well-conditioned covariance matrix. This requirement does not present a problem when long sequences are used. In practice, however, the limited length of the sequence suggests that the validity of this assumption should be checked and the PRBS regenerated if the condition fails.

As previously mentioned, a standard least squares algorithm is used to estimate the parameters of the linear model which are then used to compute the entries of the state-space matrices according to the equations presented above. In addition to this, the parameter estimation algorithm is modified in order to improve its reliability and its ability to yield estimates that emphasize the fit of the plant characteristics in a given frequency range (weighted least-squares). The latter is achieved in a straightforward manner by filtering the input-output data numerically, with a filter that has a desired frequency response. For example, a low-pass filter could be used in cases of data corrupted by high-frequency noise, while a band-pass filter could be used to enhance the reliability of the identified model around the desired closed-loop bandwidth. The success of the identification and the possible redesign of these filters are judged based on "uncertainty" bounds that are discussed subsequently. It should be emphasized that although some iterations may be required in the parameter estimation step, these do not necessarily require repetition of the identification experiment.

Further, and in order to improve the numerical reliability of the estimator, singular value decomposition methods are employed to compute the least-squares solution. In addition to this, the estimation step solves, in one embodiment, the following problem $$\min \|H\theta\|, \text{ subject to: } \|y - \theta w\| \leq (1+\rho) E_{LS}$$

where H is a weighting matrix, $\rho$ is a threshold parameter and $E_{LS}$ is the error corresponding to the least-squares solution. While this problem can be solved easily in closed form, its solution possesses some interesting properties. That is, by choosing the threshold parameter to be sufficiently "small" (e.g., 0.5) the quality of the estimated parameters measured by the estimation error deteriorates in a controlled fashion, by at most a factor of $(1+\rho)$. This allows the flexibility to adjust the estimated parameters so as to reflect more subtle estimation objectives. For example, by appropriately choosing the weighting matrix H, the solution of the above minimization can emphasize coupling and/or stability properties of the identified model. This ability has been found to be beneficial in cases of noisy data where the noise may cause the reactor to appear as more coupled than it is in "reality." Alternatively, it may be desirable for a reactor model to be as decoupled as possible, something that simplifies the controller design and can possibly improve its robustness to reactor variations.

The obtained reactor model is then checked for minimality using standard reduction algorithms, (see Chiang, R. and M. Safonov, *Robust Control Toolbox: User's Manual (For use with MATLAB)*, The Mathworks Inc., Natick, Mass., 1992) and references therein, and the reliability of the model is quantified by analysis of residuals. This step quantifies confidence in the model and provides constraints that should be met during the controller design step. In particular, performing a spectral analysis on the estimation error provides estimates of the effective multiplicative and feedback uncertainty (see Alexander, C. and K. S. Tsakalis, "Control of an Inverted Pendulum: A Classical Experiment Revisited," *Proc. 1995 Western Multiconference, Society for Computer Simulation*, Las Vegas, 1995). These estimates represent bounds that the closed-loop sensitivity and complementary sensitivity should satisfy so that the designed controller will stabilize the actual reactor. It should be pointed out that the computations provide only an estimate of these bounds. In a strict sense, closed-loop stability cannot be guaranteed. However, there appears to be a very strong correlation between these bounds and successful controller designs.

Controller Design

The core of the controller design procedure is the Hoo design approach (see Chiang, R. and M. Safonov, *Robust Control Toolbox: User's Manual (For use with MATLAB)*, The Mathworks Inc., Natick, Mass., 1992), augmented by controller reduction and well-posedness checks. More specifically, the uncertainty bounds resulting from the system identification step are used to define sensitivity and complementary sensitivity weights. These, together with the identified reactor, augmented by integrators, form the so-called super-plant in the format required by standard Hoo computational software. Typically, the resulting Hoo controller is of high order and contains states due to the weights that are essentially irrelevant for its performance and can potentially degrade its reliability, robustness and discretization properties. For this reason, the reduction is performed in three steps.

The first step is to remove states that correspond to very fast modes, e.g., two orders of magnitude above the closed-loop bandwidth. Typically, such modes are irrelevant to the controller stability or performance but they create problems in digital implementation since their discrete-time approximation requires high sampling rates. The next step is to remove very slow modes which again contribute very little to the overall closed-loop behavior. Such modes are typically associated with "pole-zero cancellations" near the jw-axis and, if retained, may cause the appearance of small but slowly decaying errors in the tracking performance. Finally, a standard model order reduction (weighted or not) is performed to eliminate other controller states that have insignificant contribution. The reduction step is a price paid in order to simplify the weight selection step. Even though a verification is made that the reductions did not cause any significant performance deterioration, this verification is relatively straightforward and can be performed easily with standard computational tools, e.g., (see Chiang, R. and M. Safonov, *Robust Control Toolbox: User's Manual (For use with MATLAB)*, The Mathworks Inc., Natick, Mass., 1992, and Zhou, K., J. Doyle and K. Glover, *Robust and Optimal Control*, Prentice-Hall, Englewood Cliffs, N.J., 1996).

The above procedure computes a controller of reasonable order that exhibits good performance with the linearized model of the reactor. That is, the actual system is expected to exhibit similar performance locally around the operating point. For a successful controller implementation, however, saturation nonlinearities that are invariably present in all actuators, e.g., heating elements, should be considered. The main problem caused by such saturations is the so-called integrator wind-up. Typical anti-windup modifications include the use of a stabilizing feedback around the compensator that is activated by a dead-zone type nonlinearity when the controller output (control input) exceeds the saturation level (see Astrom, K. J. and B. Hagglund, *PID Controllers: Theory, Design and Tuning*, ISA Research Triangle Park, N.C., 1994).

A simple way to achieve this in the multivariable case, is by feeding back to the compensator an auxiliary signal "v" computed as $$v = L u d(u)$$

where u is the control input, d(u) is a scalar, dead-zone-like signal quantifying the level of saturation (d(u)=0 when the control is not saturated) and L is a matrix gain such that the closed-loop system of the controller and L is stable. An effective design of L can be obtained as an observer gain (see Anderson, B. D. O. and J. B. Moore, *Optimal Control: Linear Quadratic Methods*, Prentice-Hall, Englewood Cliffs, N.J., 1990). In this case, the controller-observer gain system can be nicely interpreted as the construction of an observer which forces the controller output to track the output of a system that consists of the controller composed with the saturation nonlinearity. This, together with the minimality of the controller ensure that its states, and in particular those associated with the integrators cannot grow unbounded. Furthermore, in the design of the observer gain, the directionality properties of the controller can be preserved as much as possible, so that the controller saturation does not completely destroy the output decoupling achieved by the linear design.

Finally, as a last step in the controller design procedure, an evaluation step is performed via nonlinear simulation of the discretized controller and identified reactor, together with the actuator saturation. This evaluation has been very useful in exposing possible design limitations and assessing the controller capabilities, e.g., in terms of achievable ramp rates. Practical experience indicates that the simulated behavior of the closed loop system is indeed a good approximation of the actual one.

After design, in step 118, the spike, profile, and wafer controllers 96, 98, and 100 and the on-line wafer model are implemented in hardware in the temperature subsystem 68.

In the illustrated embodiment, a control mode logic circuit is selectable from among different available control mode logic circuits including an element control mode logic circuit (FIG. 7) defining an element control mode, a base control mode logic circuit (FIG. 8) defining a base control mode, a dynamic control mode logic circuit (FIG. 9) defining a dynamic control mode, and a Dt control mode logic circuit (FIG. 10) defining a Dt control mode. Each of these control mode logic circuits are defined by a single one or a combination of the controllers 96, 98, and 100.

Figure 9:
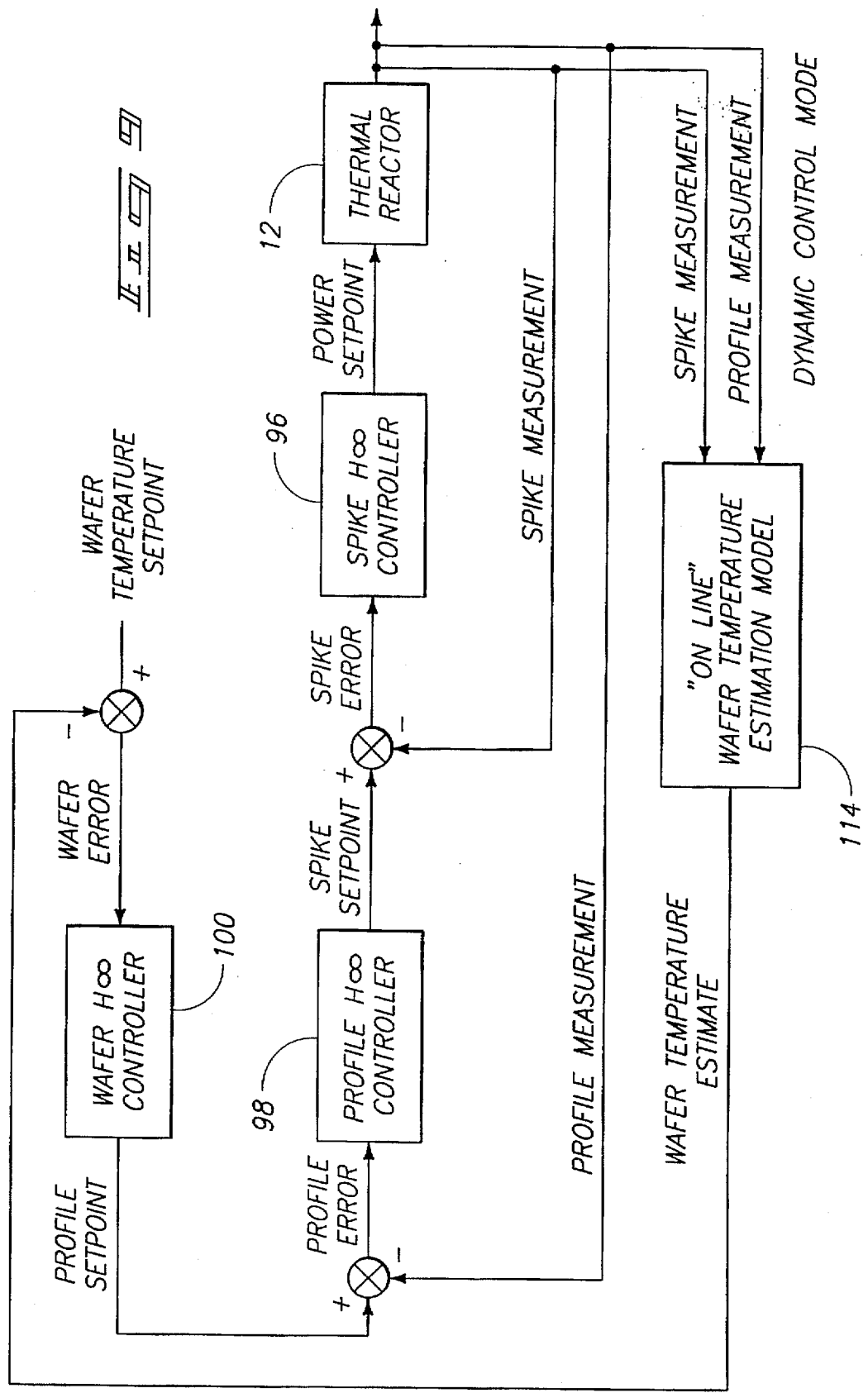
FIG. 9 is a control diagram of a dynamic control mode logic circuit, which employs a wafer controller, the profile controller of FIG. 8, and the spike controller of FIG. 7.
Figure 10:
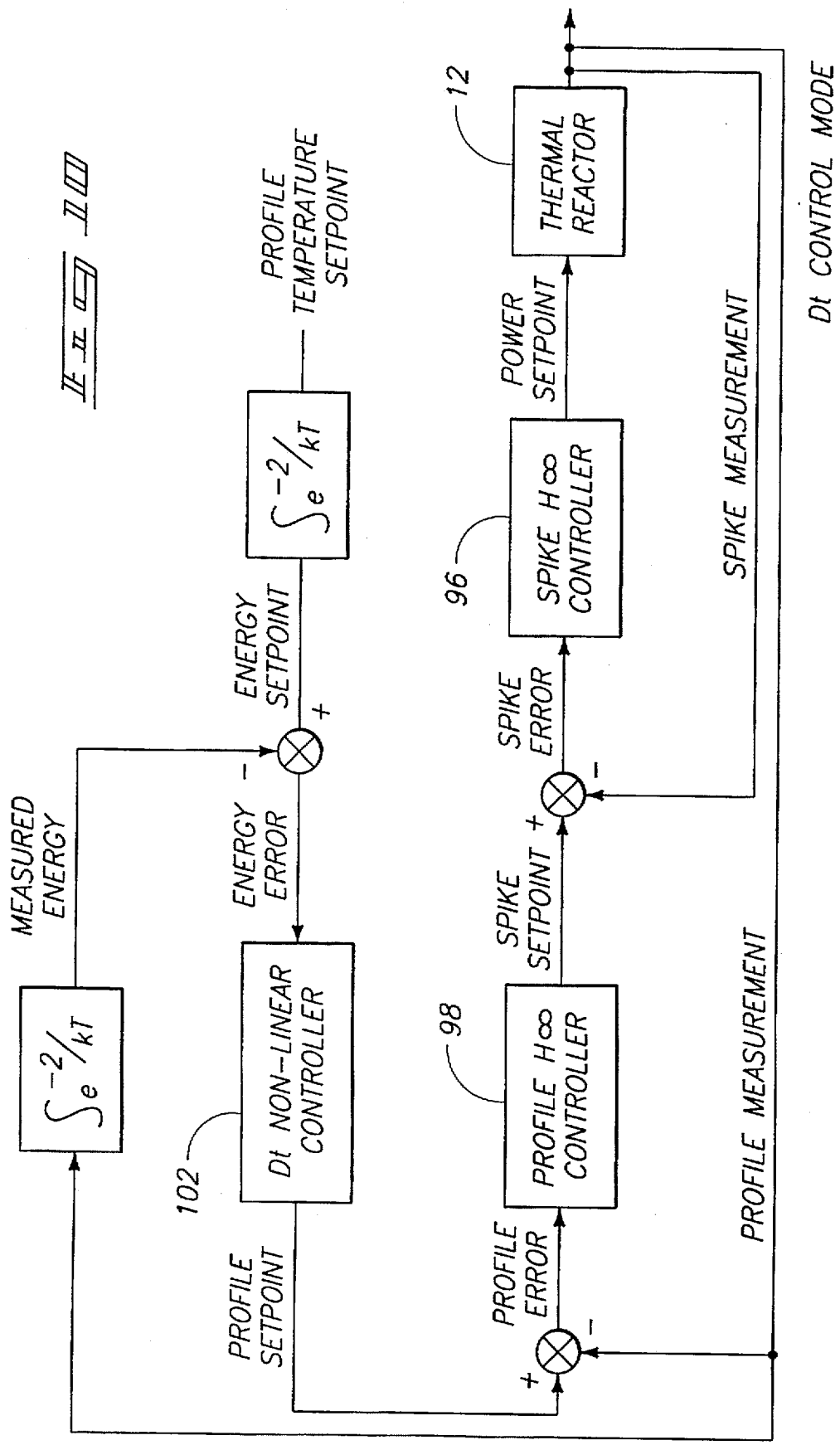
FIG. 10 is a control diagram of a Dt control mode logic circuit, which employs a Dt non-linear controller, the profile controller of FIG. 8, and the spike controller of FIG. 7.

More particularly, the temperature subsystem 68 employs the spike controller 96 for the element control mode (FIG. 7). The temperature subsystem 68 employs the spike controller 96 injected with the pseudo-random binary sequence for the characterization control mode (FIG. 6). The temperature subsystem 68 employs a combination of the profile controller 98 and the spike controller 96 for the base control mode (FIG. 8). The temperature subsystem 68 employs a combination of the wafer controller 100, the profile controller 98, and the spike controller 96 for the dynamic control mode (FIG. 9). The temperature subsystem 68 employs the non-linear Dt controller 102 with the profile controller 98, and the spike controller 96 to provide the Dt control mode (FIG. 10).

A user can provide a recipe comprising multiple steps and which uses any one of the control modes in each step. For example, a user can provide a recipe that switches from one control mode to another at a given stage of semiconductor processing. One suggested approach is to employ the base control mode during a furnace check and push in of the boat 18, prior to a ramp up in temperature, to employ the wafer control mode during temperature ramp up and temperature stabilization, to employ the Dt control mode during wafer processing steps, and to employ the base control mode during boat push out. Another suggested approach is to use the base control mode during all processing steps.

The element control mode is typically a maintenance mode (e.g., to burn in elements). In the element control mode, the spike controller controls on the basis of spike thermocouple temperatures. The mode is not used in normal processing of wafers.

The base control mode (FIG. 8) is the default mode of operation. In the base control mode, the profile controller 98 provides a spike setpoint control signal based on a profile error. The profile error is based on the difference between profile temperature setpoint, and profile temperature measurements by the profile thermocouples 42. The spike controller 98 controls power to the thermal reactor based on spike error. The spike error is based on the difference between spike setpoint and spike temperature measurements by the spike thermocouples 36. The base control mode provides accurate control resulting in improved process uniformity and cycle time reduction attributed to faster stabilization times. The base control mode logic circuit uses the profile and spike controllers simultaneously by cascading them together.

Profile thermocouples do not match temperatures at the edge of a load. Users prefer not to change their recipes to compensate for this. One solution to this problem is to shorten profile thermocouples which results in readings generated by the profile thermocouples more accurately matching temperatures at the edge of a load. The dynamic or wafer control mode (FIG. 9) provides a solution to the problem without requiring modification of the profile thermocouples or adjustment of the user's recipe.

In the dynamic control mode, the wafer controller 100 provides prediction or estimation of the temperatures of wafers 28 and control to achieve temperatures for the wafers 28 which approach the desired or recipe wafer temperatures. The dynamic control mode may be most advantageously employed during temperature ramping and stabilization steps. The dynamic control mode involves the prior use of the thermocouple instrumented wafers 44 during modeling, as discussed above. After modeling, while the control system is in use, the dynamic control mode controls the thermal reactor 12 based on predicted wafer temperature using the on-line wafer temperature estimating model 114. The on-line wafer temperature estimation model 114 predicts wafer temperature based on measurements from the spike and profile thermocouples 36 and 42. More particularly, wafer temperature is predicted based on measurements from the spike and profile thermocouples 36 and 42 and the relationship between measurements taken by the thermocouple instrumented wafers 44 (representing wafer temperature) and measurements taken by the profile and spike thermocouples 36 and 42 during modeling.

In the dynamic control mode, the wafer controller 100 provides a profile setpoint based on a wafer error. The wafer error is based on the difference between profile temperature setpoint, and profile temperature measurements by the profile thermocouples 42. The profile controller provides a spike setpoint control signal based on profile error. The profile error is based on the difference between profile temperature setpoint produced by the wafer controller 100, and profile temperature measurements by the profile thermocouples. The spike controller controls power to the thermal reactor based on spike error. The spike error is based on the difference between spike setpoint and spike temperature measurements by the spike thermocouples 36. The dynamic control mode uses the spike controller 96, the profile controller 98, and the wafer controller 100 cascaded together.

In the Dt or thermal budget mode, the Dt controller 102 measures temperature exposure or applied thermal energy and controls energy with respect to setpoint or desired energy. Thermal budget is controlled, using measurements from profile thermocouples 42 and taking the integral of $e^{(-2/kT)}$ where k is Boltzmann's constant and T is temperature measured using the profile thermocouples 42, to maintain Dt values in accordance with desired energy. A calculation is made of energy sent into the thermal reactor, and energy sent into the thermal reactor is controlled. The thermal budget mode is advantageously used to control thermal budget during critical processing steps to maintain consistent Dt values both down the load and run-to-run.

In the Dt control mode (FIG. 10), the Dt controller 102 provides a profile setpoint based on an energy error. The energy error is based on the difference between an energy setpoint, and measured energy. The profile controller 98 provides a spike setpoint control signal based on a profile error. The profile error is based on the difference between profile temperature setpoint produced by the Dt controller, and profile temperature measurements by the profile thermocouples 42. The spike controller 96 controls power to the thermal reactor based on spike error. The spike error is based on the difference between spike setpoint and spike temperature measurement by the spike thermocouples 36.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A controller unit for controlling a thermal processor including a heating element powered by a power source, and having profile thermocouples and spike thermocouples, the controller unit comprising:

an on-line model which predicts wafer temperature; and a plurality of selectable control mode logic circuits which control the heating element in response to the on-line model, the profile thermocouples, and spike thermocouples;

wherein the control mode logic circuits include a thermal budget control mode logic circuit which controls energy provided to the thermal processor relative to desired energy, by using measurements from profile thermocouples and taking the integral of $e^{(-2/kT)}$ where k is Boltzmann's constant and T is temperature measured using the profile thermocouples.

2. A controller unit in accordance with claim 1 wherein the control mode logic circuits include a dynamic control mode logic circuit which controllably supplies power to the heating element based on predicted wafer temperature, the dynamic control mode logic circuit including an on-line wafer model in which wafer temperature is predicted based on measurements from the spike and profile thermocouples.

3. A controller unit in accordance with claim 1 wherein the control mode logic circuits include a base control mode logic circuit which controls power supplied to the heating element in response to measurements by the profile thermocouples.

4. A controller unit for controlling a thermal reactor including a heating element powered by a power source, and having profile thermocouples and spike thermocouples, the controller unit comprising:

an on-line model which predicts wafer temperature based on measurements from the spike and profile thermocouples; and a plurality of selectable control mode logic circuits, the control mode logic circuits including a base control mode logic circuit having a spike controller which controls power supplied to the heating element in response to measurements by the spike thermocouples, and a profile controller which controls the spike controller in response to measurements by the profile thermocouples; a thermal budget control mode logic circuit which measures energy provided to the thermal reactor and controls energy provided to the thermal reactor with respect to desired energy, the thermal budget control mode logic circuit employing the spike controller, and the profile controller, and the thermal budget control mode logic circuit further including a Dt controller controlling the profile controller; and a dynamic control mode logic circuit which controls energy provided to the thermal reactor based on predicted wafer temperature, the dynamic control mode logic circuit employing the spike controller, the profile controller, and the on-line model, the dynamic control mode logic circuit further including a wafer controller in communication with the on-line model and controlling the profile controller.

5. A controller unit in accordance with claim 4 wherein the controllers are respectively derived from off-line models.

6. A method for controlling a thermal processor used to process semiconductors, the thermal processor having a plurality of heating elements powered by at least one power source, a plurality of profile thermocouples, and a plurality of spike thermocouples, the method comprising:

modeling dynamic thermal characteristics of the thermal processor, said modeling including providing thermocouple instrumented wafers in the thermal processor, perturbing the thermal processor by controlling the plurality of heating elements using a stimulation sequence which controllably activates the heating elements to produce varying heating effects, and developing at least one model based on changes in temperature caused by said perturbing;

wherein said developing at least one model includes:
    developing at least a first model which relates power input to changes in spike thermocouple readings;
    developing at least a second model which relates spike thermocouple readings to changes in profile thermocouple readings; and,
    developing at least a third model which relates both profile and spike thermocouple readings to thermocouple instrumented wafer readings;

controlling the delivery of power from the at least one power supply to the plurality of heating elements using at least one controller which utilizes at least one of said first, second or third models in estimating power requirements needed to achieve a desired process recipe.

7. A method according to claim 6 and further defined by selecting a control mode from a plurality of available control modes utilizing one or more of said first, second or third models.

8. A method according to claim 6 and wherein one of the available control modes is a thermal budget control mode in which energy provided to the thermal reactor is measured and controlled with respect to a desired energy budget.

9. A method according to claim 6 and wherein one of the available control modes is a thermal budget control mode in which energy provided to the thermal processor is measured and controlled with respect to a desired energy budget; wherein said energy budget is measured using the integral of $e^{(-2/kT)}$ where k is Boltzmann's constant and T is temperature measured using the profile thermocouples.

10. A method according to claim 6 and wherein one of the available control modes is a dynamic control mode in which power is controllably supplied to the heating element based on predicted wafer temperature, and in which wafer temperature is predicted based on measurements from the spike and profile thermocouples.

11. A method according to claim 6 and wherein one of the available control modes is a base control mode, in which power is controllably supplied to the heating element in response to profile thermocouple measurements.

12. A controller unit for controlling a thermal processor used to process semiconductor wafers, the thermal processor including a plurality of heating elements powered by at least one power source, a plurality of profile thermocouples, and a plurality of spike thermocouples, the controller unit comprising:

an on-line model which predicts wafer temperature based on measurements from the spike and profile thermocouples; said on-line model including:
    at least one first model which relates power input to changes in spike thermocouple readings;
    at least one second model which relates spike thermocouple readings to changes in profile thermocouple readings; and,
    at least a third model which relates both profile and spike thermocouple readings to thermocouple instrumented wafer readings;

a controller for determining the delivery of power from the at least one power supply to the plurality of heating elements using at least one of said first, second or third models in estimating power requirements needed to achieve a desired process recipe.

* * * * *